United States Patent
Janssen

(10) Patent No.: US 6,956,403 B2
(45) Date of Patent: Oct. 18, 2005

(54) OUTPUT DRIVE COMPRISING AN IMPROVED CONTROL CIRCUIT

(75) Inventor: Hendrikus Johannes Janssen, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/496,481

(22) PCT Filed: Nov. 25, 2002

(86) PCT No.: PCT/IB02/05048
§ 371 (c)(1),
(2), (4) Date: May 24, 2004

(87) PCT Pub. No.: WO03/047105
PCT Pub. Date: Jun. 5, 2003

(65) Prior Publication Data
US 2005/0040866 A1 Feb. 24, 2005

(30) Foreign Application Priority Data
Nov. 27, 2001 (EP) ............................. 01204584

(51) Int. Cl.$^7$ ......................................... H03K 19/0175
(52) U.S. Cl. ........................................ 326/83; 326/27
(58) Field of Search .................................... 326/82–90

(56) References Cited

U.S. PATENT DOCUMENTS

| | | | | |
|---|---|---|---|---|
| 5,021,684 A | * | 6/1991 | Ahuja et al. ................... | 326/27 |
| 5,218,239 A | * | 6/1993 | Boomer ......................... | 326/27 |
| 5,568,081 A | * | 10/1996 | Lui et al. ..................... | 327/380 |
| 6,326,810 B1 | * | 12/2001 | Keeth ........................... | 326/83 |
| 6,535,020 B1 | * | 3/2003 | Yin .............................. | 326/83 |
| 6,759,872 B2 | * | 7/2004 | Lai et al. ...................... | 326/81 |

* cited by examiner

Primary Examiner—Don Le
(74) Attorney, Agent, or Firm—Aaron Waxler

(57) ABSTRACT

An electronic circuit comprising an output driver (DRV) for supplying a control signal ($U_0$), comprising a first power supply terminal ($V_{DD}$); a second power supply terminal ($V_{SS}$); a signal input terminal (IN) for receiving an input signal ($U_i$); a signal output terminal (OUT) for supplying the control signal ($U_0$); an output transistor ($T_1$) having a control terminal, and having a main current path coupled between the first power supply terminal ($V_{DD}$) and the signal output terminal (OUT); and a control circuit (CNTRL) responsive to the input signal ($U_i$) which supplies a control signal ($U_1$) to the control terminal of the output transistor ($T_1$), which control circuit (CNTRL) comprises a buffer (BF) having an output which is coupled to the control terminal of the output transistor ($T_1$), and having a first power terminal which is coupled to the first power supply terminal ($V_{DD}$). The control circuit also supplies a further control signal ($U_2$) to the control terminal of a further output transistor ($T_2$) which has a main current path coupled between the signal output terminal (OUT) and the second power supply terminal ($V_{SS}$). The input signal ($U_i$) controls a switch S. In consequence, an input of the buffer is charged with a current value I by means of current source ($J_1$) or discharged with a current value I by means of current source ($J_1$) and current source ($J_2$). Thus a digital signal which is responsive to the input signal ($U_i$) is available at the input of the buffer (BF). The control circuit (CNTRL) further comprises a control field effect transistor ($T_3$) having a gate, a source connected to a second power terminal of the buffer (BF), and a drain connected to the second power supply terminal ($V_{SS}$). A zener diode ($Z_1$) is connected between the second power supply terminal ($V_{DD}$) and the gate of the control field effect transistor ($T_3$). A third current source ($J_3$) supplies current through the zener diode ($Z_1$). The potential at the gate of the control field effect transistor ($T_3$) is stabilized with respect to the potential at the first power supply terminal ($V_{DD}$). Therefore also the potential ($V_{RF}$) at the source of the control field effect transistor ($T_3$), and thus at the second power terminal of the buffer (BF), is more or less stabilized with respect to the potential at the first power supply terminal ($V_{DD}$). The control field effect transistor ($T_3$) receives the current from the second power terminal of the buffer (BF) and transfers it to the second power supply terminal ($V_{SS}$).

5 Claims, 3 Drawing Sheets

OUTPUT DRIVE COMPRISING AN IMPROVED CONTROL CIRCUIT

The invention relates to an electronic circuit comprising an output driver for producing a control signal, including a first supply terminal; a second supply terminal; a signal input terminal for receiving an input signal, a signal output terminal for supplying the control signal; an output transistor having a control electrode and a main current path which is coupled between the first supply terminal and the signal output terminal; and a control circuit which supplies a control signal to the control electrode of the output transistor in response to the input signal, the control circuit comprising a buffer of which an output is coupled to the control electrode of the output transistor and of which a first supply connection point is coupled to the first supply terminal.

Such an electronic circuit is known from the general state of the art as shown in FIGS. 1 to 4.

FIG. 1 shows a circuit in which the output transistor is implemented via field effect transistor $T_1$ of which a source is connected to the first supply terminal $V_{DD}$ and a drain is connected to the signal output terminal OUT. The circuit further includes a further output transistor which is implemented via field effect transistor $T_2$ of which a source is connected to the second supply terminal $V_{SS}$ and a drain is connected to the signal output terminal OUT. A load $Z_L$ for receiving the control signal $U_0$ is coupled between the signal output terminal OUT and the second supply terminal $V_{SS}$. The circuit further includes a control circuit CNTRL which has a signal input terminal IN for receiving the input signal $U_i$. The control circuit CNTRL produces a control signal $U_1$ between the gate and source of the output transistor $T_1$ in response to the input signal $U_i$, and a control signal $U_2$ between the gate and source of the further output transistor $T_2$. The control signals $U_1$ and $U_2$ are such that when the output transistor $T_1$ is turned on, the further output transistor $T_2$ is not, and vice versa.

The invention particularly relates to the case where a supply voltage of the electronic circuit, which supply voltage is coupled between the first and second supply voltage terminals, is relatively high, for example 100 volts. Especially when used in an integrated circuit, this high supply voltage gives rise to a complicated control circuit. After all, a standard buffer circuit which is designated BF in FIG. 1 can then not be fed directly from the supply voltage, because the gate source voltage of the output transistor $T_1$ cannot withstand such a high voltage. Worded differently, a logical low level on the gate of the output transistor $T_1$ still has a relatively high value (for example 95 volts if the supply voltage is 100 volts) compared to the supply voltage. The control of the further output transistor $T_2$, however, does not have this problem. This is because the input signal $U_i$ is referred to the second supply terminal or to the source of the further output transistor $T_2$. In this patent application the control of the further output transistor $T_2$ is not described because it may be applied according to known techniques.

In the general state of the art a solution for controlling the output transistor $T_1$ is offered in a way as shown in FIG. 2. If the gate voltage of the output transistor $T_1$ is to be logically high and the output transistor $T_1$ must not become conductive, the switch is in the open state as shown, so that the current source which is coupled between the switch and the second supply terminal $V_{SS}$ cannot produce current through the resistor R which is coupled between the gate and source of the output transistor $T_1$. As a result, the gate-source capacitance of the output transistor $T_1$ will be discharged via the resistor R so that the gate potential becomes substantially equal to the potential on the first supply terminal $V_{DD}$, thus, for example, equal to 100 volts. Now if the gate voltage of the output transistor $T_1$ is to become logically low, and thus the output transistor $T_1$ is to be turned on, the switch is closed, so that a current flows through the parallel circuit of the resistor R and a zener diode $Z_1$. A zener diode $Z_1$ provides that the potential on the gate of the output transistor $T_1$ cannot reach a value below the value displayed, for example, 95 volts.

A disadvantage of the known solution according to FIG. 2 is that the discharging of the gate-source capacitance of the output transistor through said resistor is a relatively slow process so that the circuit is unsuitable for a relatively high frequency of the input signal.

In the general state of the art the problem mentioned above is reduced by applying the circuit as shown in FIG. 3. Compared to FIG. 2, this circuit includes an additional current source and a switch connected in series with a current mirror. The moment the right-hand switch is opened, the left-hand switch is closed, so that the current mirror raises the gate voltage of the output transistor $T_1$ more rapidly (the resistor R may be omitted as appropriate). A disadvantage of this solution is that the dissipation of the circuit increases significantly from the addition of the additional current source (mind you that the supply voltage may be, for example, 100 volts!). In principle, this dissipation may be reduced by choosing a relatively low value for the additional current source. However, the current mirror is then to have a relatively large current mirror ratio. As a result, however, the capacitance on the input of the current mirror will be much larger so that the circuit again becomes slower.

An alternative prior-art circuit which reduces said disadvantages is shown in FIG. 4. A current source $J_1$ which supplies a current I is coupled between the first supply terminal $V_{DD}$ and an input of the buffer BF. A series combination of a second current source $J_2$, which supplies a current 2I, and a switch S is coupled between the input of the buffer BF and the second supply terminal $V_{SS}$. A parallel circuit of a zener diode is $Z_1$ and a smoothing capacitor C is coupled between the first supply terminal $V_{DD}$ and the second supply connection point of the buffer BF. The zener diode $Z_1$ is supplied with current by a third current source $J_3$. This circuit operates as follows. The combination of the zener diode $Z_1$ and smoothing capacitor C provides that the buffer BF receives a relatively low supply voltage (for example 5 volts), whereas the supply voltage of the circuit is relatively high (for example 100 volts). Under the control of the input signal $U_i$ the switch S is either opened, so that the voltage on the input of the buffer BF rises, or the switch is closed, so that the voltage on the input BF drops. While the switch S is being switched on or off, peak currents flowing through the supply connection points of the buffer BF may become so large that the impedance of the zener diode $Z_1$ is not low enough for the supply voltage of the buffer BF to be kept sufficiently constant. For this reason the smoothing capacitor C across the zener diode $Z_1$ is indispensable. Especially when applied in an integrated circuit, the use of the smoothing capacitor C is highly undesired. The capacitance value of the smoothing capacitor is so large that this capacitor cannot be integrated and thus is to be connected to the integrated circuit as an external component. This is further disadvantageous in that the integrated circuit then needs an additional connection pin.

It is an object of the invention to provide an electronic circuit with an output driver which is suitable for operation at a relatively high supply voltage and which is suitable for processing an input signal with a relatively high frequency and which can be used in an integrated circuit without the need for non-integrable components.

According to the invention the electronic circuit defined in the opening paragraph is characterized in that the output driver further includes a current receiving transistor which has a main current path that is coupled between a second supply connection point of the buffer and the second supply terminal, and has a control electrode for receiving a reference potential.

The current receiving transistor may comprise, for example, a field effect transistor whose source is coupled to the second supply connection point of the buffer and whose drain is coupled to the second supply terminal of the electronic circuit. A current peak from the second supply connection point of the buffer is now discharged by the current receiving transistor to the second supply terminal of the circuit without an impermissible large peak arising in the supply voltage of the buffer during this operation. This is because the source connection of the current receiving transistor is low ohmic.

An embodiment of an electronic circuit according to the invention is characterized in that the output driver further includes voltage stabilizing means for stabilizing the reference potential relative to the potential on the first supply terminal.

By stabilizing the reference potential relative to the first supply terminal in lieu of relative to the second supply terminal of the circuit, the supply voltage of the buffer remains substantially constant when the supply voltage between the first and second supply terminals is changed. For that matter, the potential on the gate of the current receiving transistor goes along with the potential on the first supply terminal of the electronic circuit. Since the gate source voltage of the current receiving transistor is substantially constant, also the potential on the second supply connection point of the buffer goes along with the potential on the first supply terminal of the electronic circuit.

An embodiment of the electronic circuit according to the invention is characterized in that the voltage stabilizing means comprise: a zener diode which is coupled between the first supply terminal and the control electrode of the current receiving transistor; and current production means for producing a current flowing through the zener diode. Since the current flowing through the zener diode is substantially independent of the current flowing through the current receiving transistor, it is not necessary to connect a smoothing capacitor in parallel with the zener diode.

An embodiment of the electronic circuit according to the invention is characterized in that the output driver further includes feedback means of which an input is coupled in series between the main current path of the current receiving transistor and the second supply terminal and of which an output is coupled to the control electrode of the current receiving transistor.

The feedback means provide a further reduction of the impedance at the source of the current receiving transistor. As a result a possible (small already) voltage peak on the source of the current receiving transistor is still further reduced.

An embodiment of the electronic circuit according to the invention is characterized in that the output driver further includes a resistor which is coupled in series with the zener diode. This series combination provides a still further reduction of the voltage peak on the source of the current receiving transistor.

The invention will be further explained with reference to the appended drawing in which.

In these Figures like components or elements are indicated by like reference signs.

Figure 1:
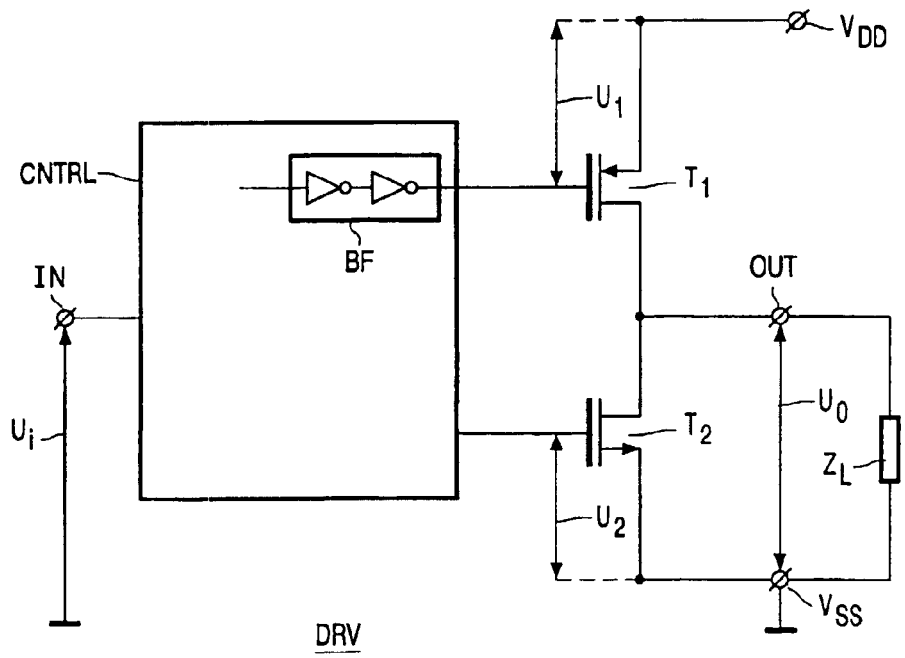
FIGS. 1 to 4 show prior art output drivers.
Figure 2:
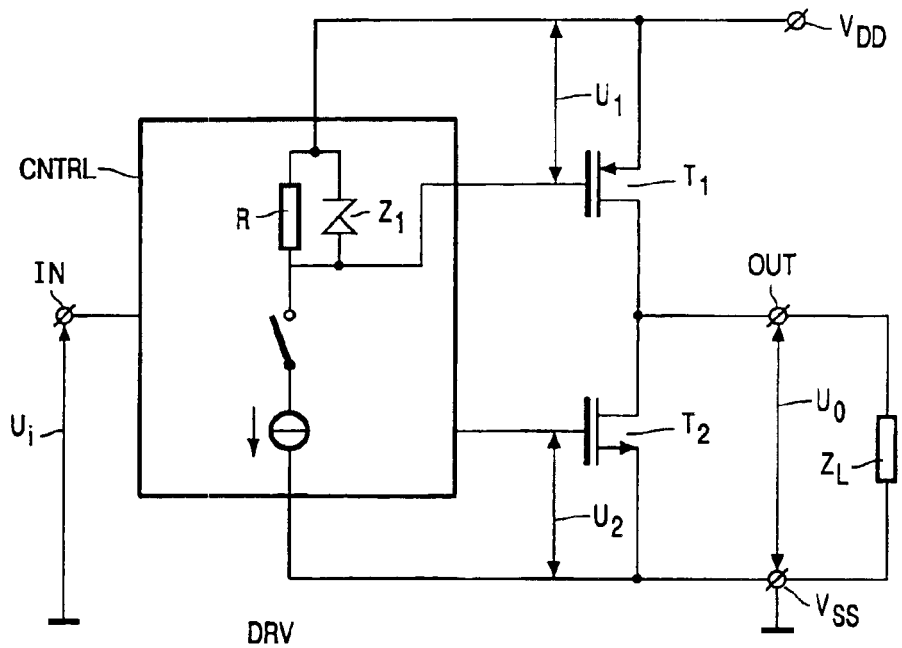
Figure 3:
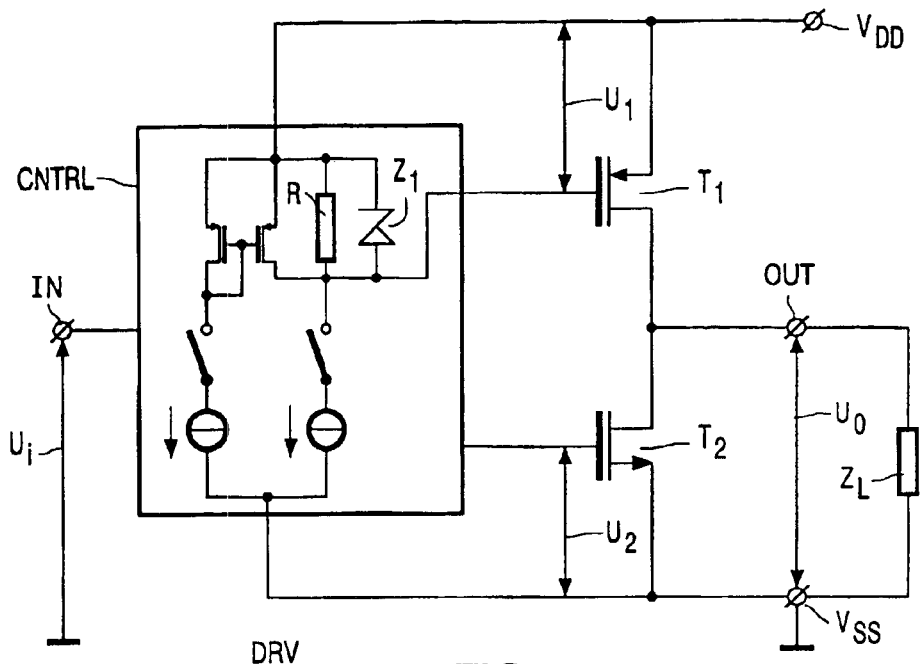
Figure 4:
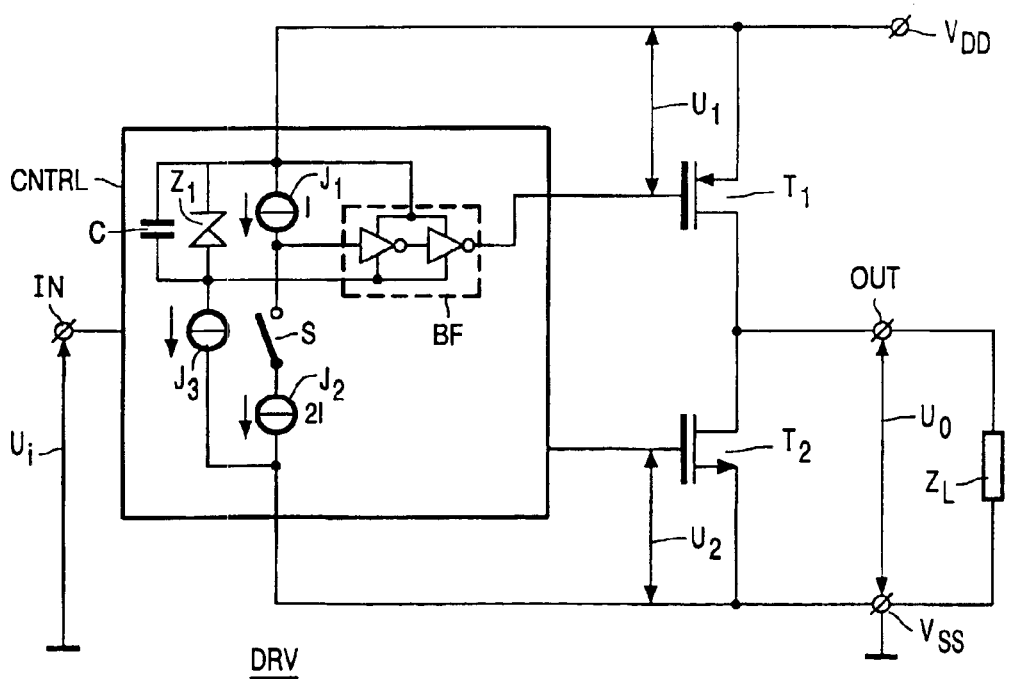
Figure 5:
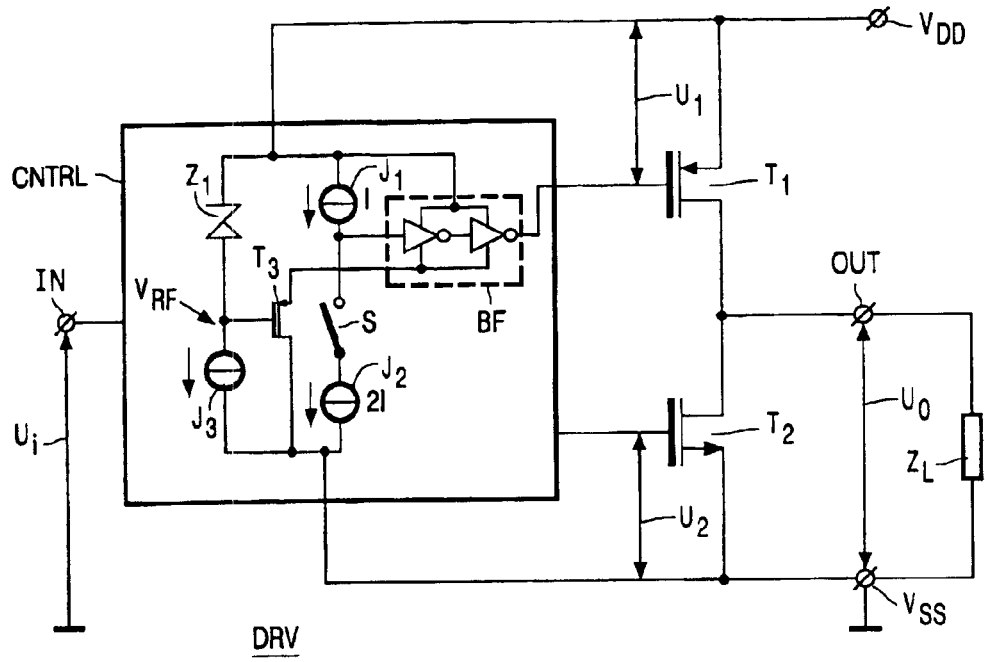
FIG. 5 shows a circuit diagram of an embodiment of an electronic circuit comprising an output driver according to the invention.

FIG. 5 shows a circuit diagram of an embodiment of an electronic circuit comprising an output driver DRV according to the invention. The output driver DRV is fed from a mains voltage which is coupled between the first supply terminal $V_{DD}$ and the second supply terminal $V_{SS}$. The output driver DRV comprises a control circuit CNTRL, an output transistor $T_1$ and a further output transistor $T_2$. The output driver DRV has an input terminal IN for receiving an input signal $U_i$ between the input terminal IN and the second supply terminal $V_{SS}$. The control circuit CNTRL sends a control signal $U_1$ to the output transistor $T_1$ in response to the input signal $U_i$ and sends a further control signal $U_2$ to the further output transistor $T_2$. As a result a control signal $U_0$ is produced on a load $Z_L$ between the output terminal OUT and the output driver DRV and the second supply terminal $V_{SS}$. The sources of the transistors $T_1$ and $T_2$ are connected to the first supply terminal $V_{DD}$ and a second supply terminal $V_{SS}$, respectively. The drains of the transistors $T_1$ and $T_2$ are connected to the output terminal OUT. The control circuit CNTRL includes a buffer BF, a first current source $J_1$, a second current source $J_2$, a third current source $J_3$, a current receive transistor $T_3$, a switch S, and a zener diode $Z_1$. An output of the buffer BF is connected to the gate of transistor $T_1$. A first supply connection point of the buffer BF is connected to a source of the first supply terminal $V_{DD}$. A second supply connection point of the buffer BF is connected to a source of transistor $T_3$. A drain of transistor $T_3$ is connected to the second supply terminal $V_{SS}$. The zener diode $Z_1$ is coupled between the first supply terminal $V_{DD}$ and a gate of transistor $T_3$. A first current source $J_1$ is coupled between the first supply terminal $V_{DD}$ and the input of the buffer BF. The switch S and the second current source $J_2$ are connected in series between the input of the buffer BF and the second supply terminal $V_{SS}$. The third current source $J_3$ is coupled between the gate of the transistor $T_3$ and the second supply terminal $V_{SS}$.

The output driver DRV operates as follows. Depending on the logic level of the input signal $U_i$, the switch S is either opened as indicated in FIG. 5, or closed. By way of example it is assumed that the switch S is open when the input signal $U_i$ has a logic low value. In that case the first current source $J_1$ which produces a current I takes the input of the buffer BF to a logic high level. As a result, the control signal $U_1$ between the gate and the source of the transistor $T_1$ is substantially equal to zero volts and the transistor $T_1$ is turned off, whereas transistor $T_2$ is turned on. As a result, a control signal $U_0$ is a logic low value. When, subsequently, the input signal $U_i$ changes from a logic low value to a logic high value, the switch S is closed. As a result, both the first and the second current source $J_1$ and $J_2$ are connected to the input of the buffer BF. The second current source $J_2$, however, produces twice as large a current as the first current source $J_1$ and, moreover, in opposite direction. In consequence, the input of the buffer BF is taken to a logic low value. The result is that the control signal $U_1$ has a logic high value, for example 5 volts. At the same time the further control voltage $U_2$ between the gate and the source of the transistor $T_2$ is substantially equal to 0 volts, worded differently, transistor $T_1$ is turned on while transistor $T_2$ is turned off, so that the control signal $U_0$ adopts a logic high value. The control signal $U_0$ will thus become equal to about 100 volts. During the change from a logic low value to a logic high value of the input signal $U_i$ and vice versa, a peak current will flow through the supply connection points of the buffer BF. This peak current, however, is received by the current receiving transistor $T_3$. Only a relatively low peak voltage is developed on the source of transistor $T_3$ because the impedance on the source of transistor $T_3$ is relatively low. The peak current is transferred to the second supply terminal $V_{SS}$ by the transistor $T_3$. Consequently, there is no peak current flowing through the zener diode $Z_1$. As a result, contrary to known output drivers, it is not necessary to decouple the zener diode $Z_1$ by a smoothing capacitor.

If the supply voltage of the output driver DRV is 100 volts by way of example and the desired supply voltage for the buffer BF is 5 volts, whereas the gate-source voltage of transistor $T_3$ is 1 volt, the potential $V_{RF}$ on the gate of transistor $T_3$ is to be set to 94 volts. This is realized by selecting a 6-volts type for the zener diode $Z_1$.

Figure 6:
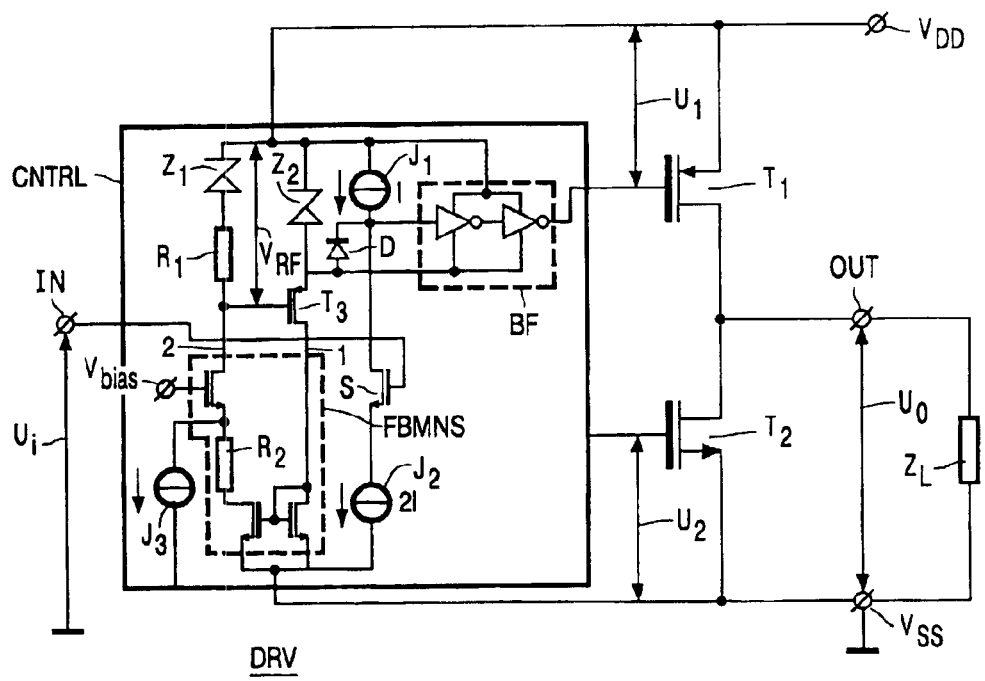
FIG. 6 shows a further circuit diagram of an embodiment of an electronic circuit comprising an output driver according to the invention.

FIG. 6 shows a circuit diagram of a further embodiment of an electronic circuit including an output driver according to the invention. The output driver DRV comprises feedback means FBMNS which is connected with an input 1 to the drain of transistor $T_3$ and with an output 2 to the gate of transistor $T_3$. The feedback means FBMNS comprise a current mirror CM whose input forms the input 1 and whose output is coupled with the gate of the transistor $T_3$ via a resistor $R_2$ and a voltage level shift transistor $T_4$. The third current source $J_3$ is now coupled between the source of transistor $T_4$ and the second supply terminal $V_{SS}$. A resistor $R_1$ is coupled in series with the zener diode $Z_1$. The switch S is arranged here as a field effect transistor which is coupled with a gate to the input terminal IN. To avoid the potential on the input of the buffer BF becoming too low, so that the voltage difference between the first supply terminal $V_{DD}$ and the input of the buffer BF could become much too high, a second zener diode $Z_2$ is coupled between the first supply terminal $V_{DD}$ and a second supply connection point of the buffer BF, and a diode is coupled between the input of the buffer BF and the second supply connection point of the buffer BF. The feedback means FBMNS provide that when the current flowing through the transistor $T_3$ increases, and thus the gate-source voltage of transistor $T_3$ increases, the current produced by the output of the current mirror CM increases. As a result, the current flowing through the series combination of the zener diode $Z_1$ and resistor $R_1$ increases, so that the voltage $V_{RF}$, which is indicated in FIG. 6, increases. In consequence, the gate voltage of the transistor $T_3$ drops. Thus the potential on the source of transistor $T_3$ remains even more constant. The resistor $R_2$ is used for limiting the maximum current that may flow through resistor $R_1$.

What is claimed is:

1. An electronic circuit comprising an output driver (DRV) for producing a control signal ($U_0$), including a first supply terminal ($V_{DD}$); a second supply terminal ($V_{SS}$); a signal input terminal (IN) for receiving an input signal ($U_i$), a signal output terminal (OUT) for supplying the control signal ($U_0$); an output transistor ($T_1$) having a control electrode and a main current path which is coupled between the first supply terminal ($V_{DD}$) and the signal output terminal (OUT); and a control circuit (CNTRL) which supplies a control signal ($U_1$) to the control electrode of the output transistor ($T_1$) in response to the input signal ($U_i$), the control circuit (CNTRL) comprising a buffer (BF) of which an output is coupled to the control electrode of the output transistor ($T_1$) and of which a first supply connection point is coupled to the first supply terminal ($V_{DD}$), characterized in that the output driver (DRV) further includes a current receiving transistor ($T_3$) which has a main current path that is coupled between a second supply connection point of the buffer (BF) and the second supply terminal ($V_{SS}$), and has a control electrode for receiving a reference potential ($V_{RF}$), wherein the output driver further comprises a voltage stabilizing means.

2. An electronic circuit as claimed in claim 1, characterized in that the output driver (DRV) further includes voltage stabilizing means for stabilizing the reference potential ($V_{RF}$) relative to the potential on the first supply terminal ($V_{DD}$).

3. An electronic circuit as claimed in claim 1, characterized in that a voltage stabilizing means comprises: a zener diode ($Z_1$) which is coupled between the first supply terminal ($V_{DD}$) and the control electrode of the current receiving transistor ($T_3$); and current production means ($J_3$) for producing a current flowing through the zener diode ($Z_1$).

4. An electronic circuit as claimed in claim 1, characterized in that the output driver (DRV) further includes feedback means (FBMNS) of which an input (1) is coupled between the main current path of the current receiving transistor ($T_3$) and the second supply terminal ($V_{SS}$), and of which an output (2) is coupled to the control electrode of the current receiving transistor ($T_3$).

5. An electronic circuit as claimed in claim 3, characterized in that the output driver (DRV) further includes a resistor ($R_1$) which is coupled in series with the zener diode ($Z_1$).

* * * * *